United States Patent [19]

Shirahata

[11] Patent Number: 5,034,345
[45] Date of Patent: Jul. 23, 1991

[54] METHOD OF FABRICATING A BUMP ELECTRODE FOR AN INTEGRATED CIRCUIT DEVICE

[75] Inventor: Hisashi Shirahata, Kanagawa, Japan

[73] Assignee: Fuji Electric Co., Ltd., Kanagawa, Japan

[21] Appl. No.: 561,457

[22] Filed: Aug. 1, 1990

[30] Foreign Application Priority Data

Aug. 21, 1989 [JP] Japan .................................. 1-214398

[51] Int. Cl.⁵ .......................................... H01L 21/441
[52] U.S. Cl. ...................................... 437/183; 437/190; 437/245
[58] Field of Search ............... 437/183, 187, 245, 189, 437/190, 192; 357/71

[56] References Cited

U.S. PATENT DOCUMENTS

| 4,113,578 | 9/1978 | Del Monte | 437/183 |
| 4,427,715 | 1/1984 | Harris | 437/183 |

Primary Examiner—Brian E. Hearn
Assistant Examiner—Chandra Chaudhari
Attorney, Agent, or Firm—Finnegan, Henderson, Farabow, Garrett and Dunner

[57] ABSTRACT

A bump electrode for connecting a semiconductor device with an external lead is disclosed. The bump electrode is designed to eliminate mechanical stress caused by molten metal flowing onto the semiconductor chip during manufacture. The bump electrode metal is formed over an upper and lower foundation film. The lower foundation film extends out laterally beyond the upper foundation film and the bump electrode metal. The lower foundation film does not get wet with the flowing molten metal, and, therefore, prevents the molten metal from flowing onto the chip.

5 Claims, 2 Drawing Sheets

METHOD OF FABRICATING A BUMP ELECTRODE FOR AN INTEGRATED CIRCUIT DEVICE

BACKGROUND OF THE INVENTION

1. Field of the Invention

The present invention relates to a bump electrode provided on an integrated circuit device. The invention particularly relates to a bump electrode for an integrated circuit device in which a bump electrode metal is provided on an electrode film to be connected to the outside of a semiconductor chip of the integrated circuit device.

2. Discussion of the Prior Art

As the art of semiconductor integrated circuits has advanced, it has become possible to build a larger number of electronic circuits or circuit elements on a single semiconductor chip. At the same time, however, the need for a greater number of contact points on the semiconductor chip has increased. Today, it is sometimes necessary to build hundreds of contact points on a small chip of only some millimeters square.

A bump electrode is a metal electrode projecting from the surface of the chip. A large number of bump electrodes may be placed on a single chip reducing the space and time needed for the external contacts. Recently, it has become possible to arrange a number of small bump electrodes, each only some scores of micrometers across, along the peripheral edge of a chip with a small pitch of about 1.5 to 2 times as long as the size. The chip contact with the outside may be produced by a simple means such as inner lead bonding.

The present invention relates to such a bump electrode for an integrated circuit device which is particularly suitable to be connected with a mate member such as a connecting lead through a heating process such as soldering. The conventional structure and main production steps of the bump electrode will be described with reference to FIG. 3.

Referring to FIG. 3, a bump electrode will be described along with the main steps of manufacturing a bump electrode. A completed bump electrode is shown in FIG. 3(d). An integrated circuit is built on a wafer 1 as shown in FIG. 3(a). An n-type epitaxial layer 2, a p-type junction separation layer 3, and a p-type semiconductor layer 4 are shown in FIG. 3(a). The surface of wafer 1 is covered with an oxide film 5. A wiring film 6 of aluminum is disposed on oxide film 5 so that a first end of wiring film 6 is connected with a semiconductor layer 4 through a window portion of oxide film 5. A protection film 7 of nitriding silicon covers oxide film 5 and wiring film 6. A bump electrode is provided on the part of the wiring film 6 exposed through a window 7a of the protection film 7.

In the step shown in FIG. 3(b), the entire exposed surface is coated with titanium to form a lower foundation film 11 for the bump electrode. The entire exposed surface is then coated with a palladium film 12a and a gold film 12b to form an upper foundation film 12. The upper foundation film 12 is then patterned by photo-etching to create the device shown in FIG. 3(b). The foundation films 11 and 12 are connected to the second end of the wiring film 6.

In the step shown in FIG. 3(c), the foundation films 11 and 12 are coated with a photo-resist film 8 and a window is opened by photo-processing through the photo-resist film 8 to expose only the upper foundation film 12. Gold as a bump electrode metal 13 is grown to a desired thickness on the upper foundation film 12 by electrolytic plating using the lower foundation film 11 as a plating electrode film. In the electrolytic plating, the lower foundation film 11 is connected with the negative terminal of a plating power source. The upper foundation film 12, within the surface of the wafer, 1 acts as a plating cathode when growing the bump electrode metal 13 on the upper foundation film 12. The bump electrode metal 13 is, thus, grown all at once. The photo-resist film 8 is then eliminated.

In order to make the completed device shown in FIG. 3(d), chemical etching is performed on the lower foundation film 11 using the upper foundation film 12 as a mask. Consequently, the lower foundation film 11 has the same pattern as the upper foundation film 12 as shown in FIG. 3(d).

A number of bump electrodes 10, each constituted by the foundation films 11 and 12, and the bump electrode metal 13 are formed a single wafer 1 with bump electrodes 10 separated from each other. By scribing and separating the wafer 1 into chips 9, flip chips of integrated circuit devices are obtained.

Referring to FIG. 3(d), a lead 20 forming an external conductor is connected to the bump electrode 10 by an inner lead bonding. Lead 20 is obtained by coating a thin copper strip having a thickness of scores of $\mu$m with a junction metal coating 21 such as tin by plating. A connection can be formed by lightly pressing coating 21 against bump electrode 10 while heating coating 21 to melt coating 21.

Only two photo-process steps are performed to produce the bump electrode 10 shown in FIG. 3(d). One photo-processing step is performed to pattern the upper foundation film 12 in the step shown in FIG. 3(b), and a second photo-process step is performed to pattern the photo-resist film 8 for electrolytic plating as shown in FIG. 3(c).

If a molten metal flows onto a base portion of the conventional bump electrode when an external conductor is connected to the bump electrode, the chip is apt to suffer damage from mechanical stress produced by the solidification of the molten metal. The long-term reliability of an integrated circuit device will be greatly reduced. This problem will be described with reference to the drawings.

If the heating temperature or pressing force is unsuitable when the lead 20 is joined to the metal 13 of the bump electrode 10, a metal 21a formed by melting the junction metal coating 21 may flow along the surfaces of the bump electrode metal 13 and the foundation films 11 and 12. The flowing metal 21a will then reach the surface of the chip 9.

FIG. 4 is an enlarged diagram of the base portion of the bump electrode 10 within the circle A of FIG. 3(d). As shown in FIG. 4, a small amount of molten metal 21a may flow onto the protection film 7. Shrinking during solidification of the molten metal stresses the protection film 7 causing a crack C to appear. The crack C is too small to produce an immediate problem. However, if an integrated circuit device is used at a high temperature and a high humidity, the metal of the wiring film 6 under the protection film 7 may become corroded over time causing a pit in the wiring film 6. Eventually, the wiring film 6 will be broken or disconnected.

SUMMARY OF THE INVENTION

An object of the present invention is to provide a bump electrode of an integrated circuit device in which mechanical stress does not occur during manufacturing even if a molten metal flows onto a base portion of the bump electrode at the time of connection with an external conductor.

A further object of the invention is to provide a method for producing a bump electrode which minimizes the number of photo processing steps.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

The objects of the invention are achieved by providing a bump electrode for connecting a semiconductor device to an external lead by melting a junction metal coating. The bump electrode has a semiconductor substrate containing the semiconductor device; a conducting layer formed on the semiconductor substrate having first and second ends, the first end connected to the semiconductor device; a protection layer formed over the conducting layer having an aperture toward the second end of the conducting layer; a lower foundation film of material which does not get wet by the junction metal coating formed on the protection layer over the aperture, the lower foundation film in electrical contact with the conducting layer through the aperture; an upper foundation layer formed on the lower foundation layer, the lower foundation extending laterally beyond the upper foundation; a bump electrode metal formed on the upper and lower foundation layers, the bump electrode metal extending laterally beyond the upper foundation layer and the lower foundation layer extending laterally beyond the bump electrode metal. In the bump electrode the junction metal coating cannot flow past the lower foundation film.

A process for manufacturing the bump electrode for connecting a semiconductor device to an external lead by melting a junction metal coating comprises the steps of: providing a semiconductor substrate having the semiconductor device formed in the semiconductor substrate; forming a conductivity layer having first and second ends on the semiconductor substrate so that the first end is in electrical contact with the semiconductor device; forming a protective layer over the conductivity layer, the protective layer having an aperture toward the second end of the conductivity layer; forming a lower foundation layer of material which does not get wet by the junction metal coating over the protective layer and the aperture; forming an upper foundation layer over the lower foundation layer; placing a photo resist film over the upper foundation layer; exposing the portion of the photo resist film on the upper foundation layer while masking the portion of the photo resist film covering the aperture; etching the upper foundation layer using the remaining photo resist film as a mask; growing a bump electrode metal on the lower foundation layer, the bump electrode metal covering the upper foundation layer and the bump electrode having an upper portion laterally extending beyond the lower portion of the bump electrode; placing a photo resist layer over the lower foundation layer; exposing the photo resist layer using the upper portion of the bump electrode as a mask; and etching the lower foundation layer using the remaining photo resist layer as a mask.

In addition to the case where a junction metal coating of the lead melts out, when the bump electrode metal is solder or the like the bump electrode metal itself melts out. When the molten metal is tin or solder having a low melting point, titanium has been used as a material for a lower foundation film because it has a characteristic not to get wet with the molten metal. Accordingly, titanium may be used for the lower foundation film in the present invention.

The bump electrode metal is usually grown by electrolytic plating so that the top portion grows out laterally from the base portion.

The upper foundation film is covered with the bump electrode metal so that the effect of the laterally extended portion of the lower foundation film against the molten metal is not distributed by the upper foundation film.

DESCRIPTION OF THE DRAWINGS

The accompanying drawings, which are incorporated in and constitute a part of this specification illustrate embodiments of the invention and, together with the description, serve to explain the principles of the invention.

In the figures, like references numbers refer to similar or like parts.

DETAILED DESCRIPTION OF THE PREFERRED EMBODIMENT

Figure 1:
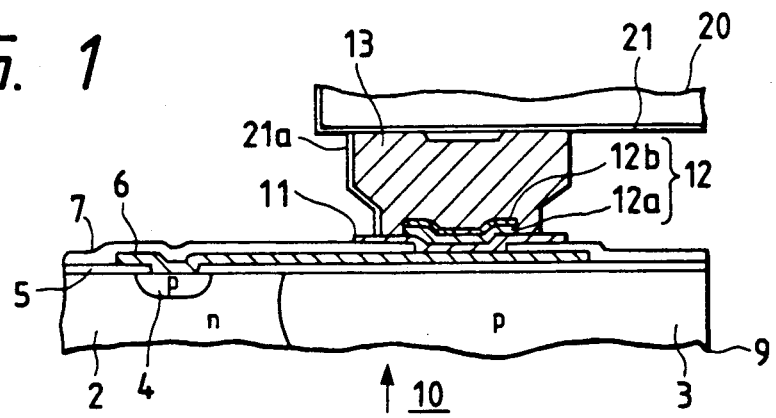
FIG. 1 is an enlarged sectional view of a main portion of a chip for an integrated circuit device, illustrating a bump electrode according to the present invention.

An embodiment of the present invention will be described with reference to the drawings. FIG. 1 is a sectional view illustrating the complete state of the bump electrode according to the present invention. FIG. 2 shows a sectioned view of the main steps in building the bump electrode onto an integrated circuit device.

The preferred embodiment of the bump electrode is shown in FIG. 1. A bump electrode metal 13 covers an upper foundation film 12. The bump electrode metal 13 preferably surrounds the upper foundation film 12. A lower foundation film 11 is formed in a pattern extending out from the peripheral surface of the base portion of the bump electrode metal 13. The lower foundation film 11 forms a pattern reflecting the top surface of the bump electrode metal 13. A metal which does not get wet with molten metal 21a is used for the lower foundation film 11. When a metal does not get wet with a molten metal, the adhesion forces are low, and as a consequence, less lateral flow should occur. For example, if the molten metal 21a is tin or solder, titanium is used for the lower foundation film 11.

A lead 20 is connected to the bump electrode 10. When the bump electrode metal 13 is gold or copper, the lead 20 is coated with tin or solder as a junction metal 21. When the lead 20 is joined to the bump electrode 10 by heating, the bump electrode metal 13 gets wet with the molten junction metal 21 to form a junction. The molten metal 21a easily flows over the peripheral surface of the bump electrode metal 13. The molten metal 21a sometimes reaches the base portion of the bump electrode metal 13. The lower foundation film 11, which does not get wet with the molten metal 21, is extended around the base portion of the bump electrode metal 13, and the molten metal 21a is prevented from flowing by the lower foundation film 11. Therefore, the molten metal 21a cannot reach the surface of the chip 9.

The method of manufacturing the bump electrode 10 on a wafer 1 will now be described with reference to FIG. 2(a)–FIG. 2(d).

Figure 2A:
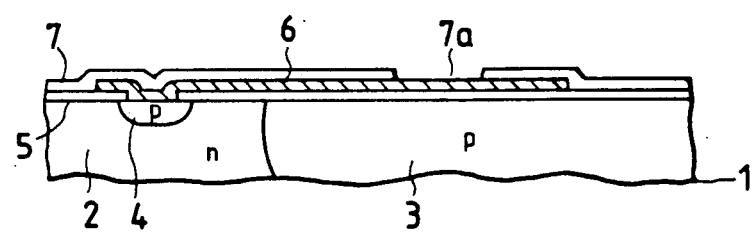
FIG. 2 shows the main steps in building the bump electrode.
Figure 3A:
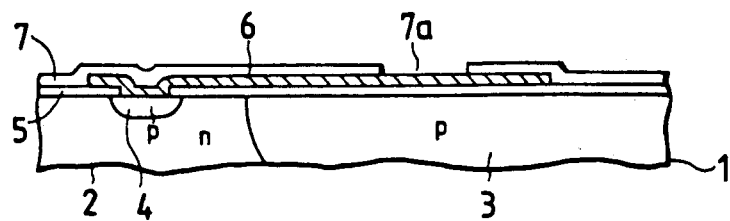
FIG. 3 shows a bump electrode according to the prior art and the main producing steps.
Figure 3B:
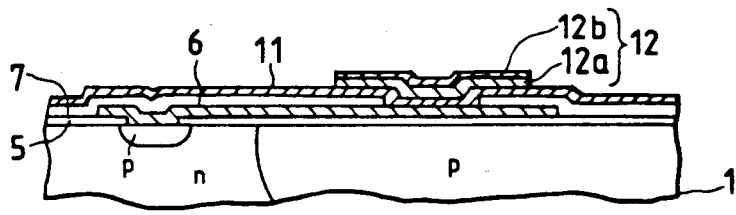

FIG. 2(a) shows the same state of the wafer 1 as shown in FIG. 3(a). The bump electrode 10 is on an open portion of a window 7a of a protection film 7. The window 7a exposes one end of a wiring film 6 of aluminum, while the other end of the wiring film 6 is connected to a semiconductor layer 4.

Figure 2B:
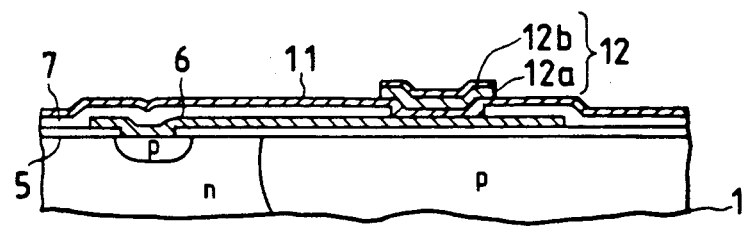

In the step shown in FIG. 2(b), a titanium film having a thickness of, approximately 0.2 $\mu$m for the lower foundation film 11 formed by a sputtering method or an evaporating method to cover the whole surface of the protection film 7. A palladium film 12a having a thickness of approximately 0.5 $\mu$m and a pair of a thin gold films 12b having a thickness of approximately 0.02 $\mu$m for the upper foundation film 12 are successively formed by a sputtering method or an evaporating method to cover the whole surface of the protection film 7. The lower foundation film 11 and the upper foundation film 12 electrically contact with the wiring film 6 through the window 7a. Using a photo-resist film as a mask, the upper foundation film 12 is formed into a small square or circular pattern by etching with, for example, hydrochloric acid.

Figure 2C:
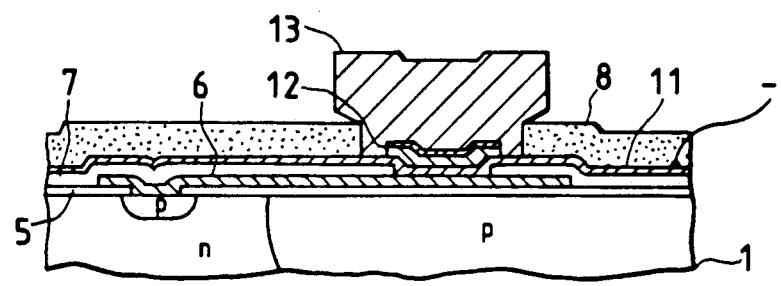

As shown in FIG. 2(c), the bump electrode metal 13 is grown by means of electrolytic plating. A positive-type photo-resist film 8 is formed in a pattern having a larger window than the area of the upper foundation film 12. Electrolytic plating is performed using the photo-resist film 8 as a mask and the lower foundation film 11 as a plating electrode film. Gold or copper, for example, as the bump electrode metal 13 is grown to a thickness of scores micrometers by the electrolytic plating.

During the electrolytic plating, the bump electrode metal 13 grows on the upper foundation film 12 and on the lower foundation film 11 exposed in the window portion of the photo-resist film 8. The bump electrode metal 13 surrounds the upper foundation film 12. The bump electrode metal 13 grows in the lateral direction as well as the vertical direction. Only the top portion of the bump electrode metal is expanded in the lateral direction. The degree of lateral expansion depends on the metal used for the bump electrode metal 13 and the conditions of the electrolytic plating. The extent of lateral expansion is approximately half of the vertical expansion.

Figure 2D:
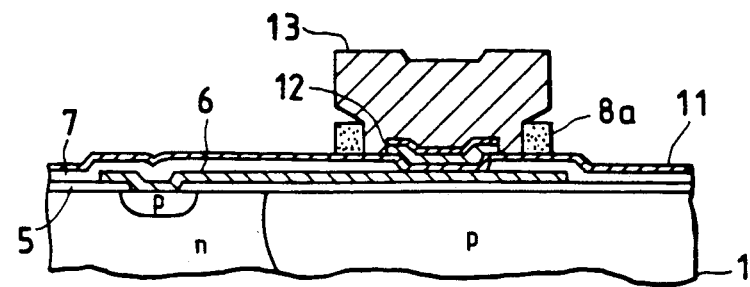
Figure 3C:
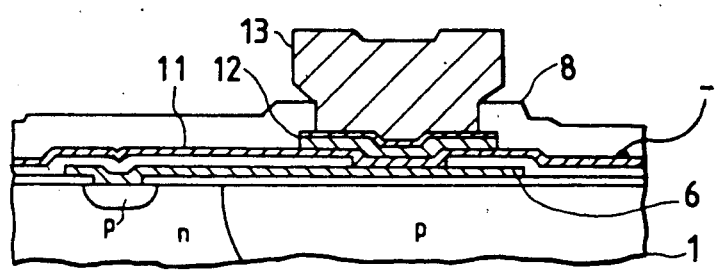
Figure 3D:
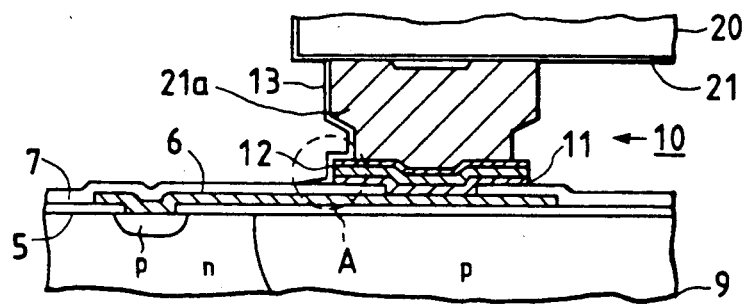
Figure 4:
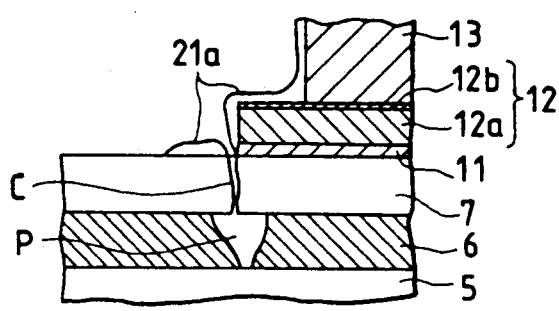
FIG. 4 shows an enlarged sectional view of a base portion of the bump electrode for explaining a conventional problem.

Referring to FIG. 2(d), the positive-type photo-resist film 8 in FIG. 3(c) is exposed and developed using the laterally extended portion of the bump electrode metal 13 as a mask. A portion of the photo-resist film 8a remains on the lower foundation film 11 formed in an annular shape around the base portion of the bump electrode metal 13. The lower foundation film 11 is chemically etched with dilute hydrofluoric acid using the remaining portion of the photo-resist film 8a as a mask. The photo-resist film 8a is then removed to reveal the completed bump electrode 10 shown in FIG. 1.

A laterally extended portion of the lower foundation film 11 is accurately formed using the laterally expanded portion of the bump electrode metal 13 as a mask. Photo-masks are only used twice to manufacture the bump electrode.

The laterally extended portion of the lower foundation film 11 according to the present invention prevents a molten metal from flowing onto the chip 9, and reduces damage to the chip 9 due to external forces produced while connecting the lead 20 to the bump electrode 10. In the conventional structure shown in FIG. 3 the pheripheral edge of the lower foundation film 11 is coextensive with the upper foundation film 12. An external force applied to the conventional bump electrode 10 from above is concentrated on the peripheral edges of the upper film 12 and the lower film 11 so that the protective film 7 is apt to be damaged locally. In the structure shown in FIG. 1 according to the present invention, external force is dispersed by the laterally extended portion of the lower foundation film 11 to relieve the lower concentration of stress on the protection film 7, and the surface of the chip. The lower foundation film 11 bonded stably with the protection film 7 protects the protection film 7 from the stress to further reduce damage such as cracks.

A long-term reliability test was performed for one month upon sample chips 9 provided with gold bump electrodes 10 according to the present invention after tin plated leads 20 were connected to the bump electrodes by an inner lead bonding method, under accelerated conditions of high temperature and high humidity. As a result, it was confirmed that troubles produced conventionally were not produced at all.

As has been described, according to the present invention, in a bump electrode including lower and upper foundation films and a bump electrode metal, the upper foundation film is covered with the bump electrode metal, and the lower foundation film is constituted by a metal which does not get wet with a molten metal at the time of connecting the bump electrode metal with a mate member, and the lower foundation film is formed in a pattern laterally extended out from the bump electrode metal, so that it is possible to obtain the following effects.

(a) In joining the bump electrode to the junction object, even if the molten metal flows to a base portion along the surface of the bump electrode metal, it is possible to prevent the molten metal from reaching the surface of a chip by a laterally extended portion of the lower foundation film.

(b) At the time of connection of the bump electrode with the mate member, even if external force is locally given to the peripheral edge of the base portion of the bump electrode, it is possible to disperse the external force by the laterally extended portion of the lower foundation film so as to reduce exceeding stress concentration of the surface of the chip, and safely protect a protection film and the surface of the chip by means of the lower foundation film.

As a result, according to the present invention, cracks are not produced in the protection film nor in the surface of the chip by local exceeding stress applied to the surface of the chip. The long-term reliability of an integrated circuit device is improved in comparison with the prior art.

Moreover, in view of realization or application of the present invention, a laterally extended portion of the lower foundation film is patterned by using a bump electrode metal as a mask by use of a top end portion of the bump electrode metal which is laterally expanded out from a base portion thereof at the time of growing the bump electrode metal by means of electrolytic plating, so that it is possible to obtain an effect that the number of times of photo-process by use of photo-mask in building a bump electrode in a chip can be made twice in the same manner as in the conventional case, and this laterally extended portion can be formed to an accurate size.

The foregoing description of preferred embodiments of the invention has been presented for purposes of illustration and description. It is not intended to be exhaustive nor to limit the invention to the precise form disclosed, and obviously many modifications and variations are possible in light of the above teachings or may be acquired from practice of the invention. The embodiments were chosen and described in order to best explain the principles of the invention and its practical application to thereby enable one skilled in the art to best utilize the invention in various embodiments and with various modifications as are suited to the particular use contemplated. It is intended that the scope of the invention be defined by the claims appended hereto.

What is claimed is:

1. A bump electrode for connecting a semiconductor device to an external lead by melting a junction metal coating, comprising:
    a semiconductor substrate containing the semiconductor device;
    a conducting layer formed on the semiconductor substrate having first and second ends, the first end connected to the semiconductor device;
    a protection layer formed over the conducting layer having an aperture toward the second end of the conducting layer;
    a foundation layer of material which does not get wet by the junction metal coating formed on the protection layer over the aperture, the foundation layer in electrical contact with the conducting layer through the aperture;
    a bump electrode metal formed on the foundation layer, a portion of the foundation layer extending laterally beyond the bump electrode metal,
    whereby the junction metal coating cannot flow past the foundation layer.

2. A bump electrode as claimed in claim 1, wherein a portion of the foundation layer forms a ring laterally extending beyond the base of the bump electrode metal.

3. A bump electrode for connecting a semiconductor device to an external lead by melting a junction metal coating, comprising:
    a semiconductor substrate containing the semiconductor device;
    a conducting layer formed on the semiconductor substrate having first and second ends, the first end connected to the semiconductor device;
    a protection layer formed over the conducting layer having an aperture toward the second end of the conducting layer;
    a lower foundation layer of material which does not get wet by the junction metal coating formed on the protection layer over the aperture, the lower foundation film in electrical contact with the conducting layer through the aperture;
    an upper foundation layer formed on the lower foundation layer, the lower foundation extending laterally beyond the upper foundation; and
    a bump electrode metal formed on the upper and lower foundation layers, the bump electrode metal extending laterally beyond the upper foundation layer and the lower foundation layer extending laterally beyond the bump electrode metal,
    whereby the junction metal coating cannot flow past the lower foundation film.

4. A process for manufacturing a bump electrode for connecting a semiconductor device to an external lead by melting a junction metal coating, comprising the steps of:
    providing a semiconductor substrate having the semiconductor device formed in the semiconductor substrate;
    forming a conductivity layer having first and second ends on the semiconductor substrate so that the first end is in electrical contact with the semiconductor device;
    forming a protective layer over the conductivity layer, the protective layer having an aperture toward the second end of the conductivity layer;
    forming a foundation layer of material which does not get wet by the junction metal coating over the protective layer and the aperture;
    growing a bump electrode metal on the foundation layer, the bump electrode metal having an upper portion laterally extending beyond the lower portion of the bump electrode;
    placing a photo resist layer over the foundation layer;
    exposing the photo resist layer using the laterally extending upper portion of the bump electrode as a mask; and
    etching the foundation layer using the remaining photo resist layer as a mask.

5. A process for manufacturing a bump electrode for connecting a semiconductor device to an external lead by melting a junction metal coating, comprising the steps of:
    providing a semiconductor substrate having the semiconductor device formed in the semiconductor substrate;
    forming a conductivity layer having first and second ends on the semiconductor substrate so that the first end is in electrical contact with the semiconductor device;
    forming a protective layer over the conductivity layer, the protective layer having an aperture toward the second end of the conductivity layer;
    forming a lower foundation layer of material which does not get wet by the junction metal coating over the protective layer and the aperture;
    forming an upper foundation layer over the lower foundation layer;
    placing a photo resist film over the upper foundation layer;
    exposing the portion of the photo resist film on the upper foundation layer while masking the portion of the photo resist film covering the aperture;
    etching the upper foundation layer using the remaining photo resist film as a mask;
    growing a bump electrode metal on the lower foundation layer, the bump electrode metal covering the upper foundation layer and the bump electrode having an upper portion laterally extending beyond the lower portion of the bump electrode;
    placing a photo resist layer over the lower foundation layer;
    exposing the photo resist layer using the upper portion of the bump electrode as a mask; and
    etching the lower foundation layer using the remaining photo resist layer as a mask.

* * * * *